(12) United States Patent
Song (10) Patent No.: US 12,131,573 B2
(45) Date of Patent: Oct. 29, 2024

(54) DISPLAY PANEL INCLUDING ACTIVE LAYERS OF TRANSISTORS AND PHOTOSENSORS DISPOSED AT A SAME LAYER, AND METHOD OF MANUFACTURING DISPLAY PANEL

(71) Applicant: WUHAN CHINA STAR OPTOELECTRONICS TECHNOLOGY CO., LTD., Hubei (CN)

(72) Inventor: Jiyue Song, Hubei (CN)

(73) Assignee: WUHAN CHINA STAR OPTOELECTRONICS TECHNOLOGY CO., LTD., Hubei (CN)

( * ) Notice: Subject to any disclaimer, the term of this patent is extended or adjusted under 35 U.S.C. 154(b) by 0 days.

(21) Appl. No.: 17/620,735

(22) PCT Filed: Dec. 15, 2021

(86) PCT No.: PCT/CN2021/138548
§ 371 (c)(1),
(2) Date: Dec. 19, 2021

(87) PCT Pub. No.: WO2023/102992
PCT Pub. Date: Jun. 15, 2023

(65) Prior Publication Data
US 2024/0071125 A1 Feb. 29, 2024

(30) Foreign Application Priority Data
Dec. 9, 2021 (CN) .......................... 202111501335.8

(51) Int. Cl.
*G06V 40/13* (2022.01)
*G06F 3/041* (2006.01)
*H01L 21/77* (2017.01)

(52) U.S. Cl.
CPC ........ *G06V 40/1318* (2022.01); *G06F 3/0412* (2013.01); *H01L 21/77* (2013.01)

(58) Field of Classification Search
None
See application file for complete search history.

(56) References Cited

U.S. PATENT DOCUMENTS

2002/0024097 A1  2/2002 Joo
2007/0131936 A1* 6/2007 Kang .................. H01L 27/1255
                                                  257/E27.113
(Continued)

FOREIGN PATENT DOCUMENTS

CN  101281887 A  10/2008
CN  105095872 A  11/2015
(Continued)

OTHER PUBLICATIONS

International Search Report in International application No. PCT/CN2021/138548, mailed on Aug. 25, 2022.
(Continued)

*Primary Examiner* — Kirk W Hermann
(74) *Attorney, Agent, or Firm* — PV IP PC; Wei Te Chung (57) ABSTRACT

A display panel includes a fingerprint recognition layer, a light path layer, and a display panel main body. The fingerprint recognition layer includes a plurality of transistors disposed in an array and a plurality of photosensors electrically connected to the plurality of transistors. Active layer patterns of the transistors and photosensitive layer patterns of the photosensors are disposed at a same layer. The amorphous silicon layers of the transistors and the photosensors are made in a single process, thereby reducing the photomask and manufacturing process.

19 Claims, 6 Drawing Sheets

(56) References Cited

U.S. PATENT DOCUMENTS

| | | | | |
|---|---|---|---|---|
| 2017/0161541 | A1* | 6/2017 | Li | .................... H01L 27/14678 |
| 2022/0036031 | A1* | 2/2022 | Cho | ................... G06V 40/1324 |
| 2022/0406088 | A1* | 12/2022 | Cai | .................... G06V 40/1318 |
| 2023/0147182 | A1* | 5/2023 | Zhao | ..................... H10K 39/34 |
| | | | | 257/40 |

FOREIGN PATENT DOCUMENTS

| | | | |
|---|---|---|---|
| CN | 110727314 | A * | 1/2020 |
| CN | 111898517 | A | 11/2020 |
| CN | 112151554 | A | 12/2020 |
| CN | 112599630 | A | 4/2021 |

OTHER PUBLICATIONS

Written Opinion of the International Search Authority in International application No. PCT/CN2021/138548, mailed on Aug. 25, 2022.

* cited by examiner

DISPLAY PANEL INCLUDING ACTIVE LAYERS OF TRANSISTORS AND PHOTOSENSORS DISPOSED AT A SAME LAYER, AND METHOD OF MANUFACTURING DISPLAY PANEL

FIELD

The present disclosure relates to display technologies, and more particularly, to a display panel, and a method of manufacturing the same.

BACKGROUND

Fingerprint recognition technologies have been widely used in small and medium-sized panels. Among them, fingerprint recognition technologies mainly include capacitive type, ultrasonic type and optical type.

At present, a more mature solution is capacitive fingerprint recognition, and its working principle is electric field formed between silicon wafers and conductive subcutaneous electrolyte. Due to height difference between the fingerprint valleys and ridges, voltages of the fingerprint valleys and ridges are different, thereby realizing accurate fingerprint measurement. However, for capacitive fingerprint recognition, when the finger is wet, its detection effect will be significantly worse due to electrical changes.

Compared with capacitive fingerprint recognition, ultrasonic fingerprint recognition technology has advantages of high penetration, more stability and more accuracy, but its cost is relatively high. Optical fingerprint recognition technology uses principle of light refraction and reflection. When the light hits the finger, it is reflected by the finger to the light sensor, and then the light sensor converts the light signal into an electrical signal. Because the fingerprint valley and fingerprint ridge reflect different light, the reflected light intensity of the fingerprint valley and fingerprint ridge received by the light sensor is different, so that different electrical signals are used for fingerprint identification.

Optical fingerprint recognition technology has good stability, strong penetrating ability, and relatively low cost. Currently, mobile phones or tablets equipped with an optical fingerprint recognition function are all equipped with self-luminous organic light emitting diode (OLED) screens. However, for mobile phones with liquid crystal display (LCD) screens, since such mobile phones have a backlight module and are limited by factors such as aperture ratio during manufacturing, it is difficult to integrate optical fingerprint recognition functions inside the LCD screen.

SUMMARY

In view of the above, the present disclosure provides a display panel, and a method of manufacturing a display panel to solve the technical issues.

In order to achieve above-mentioned object of the present disclosure, one embodiment of the disclosure provides a display panel, including:
 a fingerprint recognition layer;
 a light path layer disposed on the fingerprint recognition layer; and
 a display panel main body disposed on the light path layer, wherein
 the fingerprint recognition layer includes a plurality of transistors arranged in an array and a plurality of photosensors electrically connected to the plurality of transistors; and
 active layer patterns of the transistors and photosensitive layer patterns of the photosensors are disposed at a same layer.

In one embodiment of the display panel, the fingerprint recognition layer further includes a first metal layer and a first transparent electrical conductive layer, the first metal layer and the first transparent electrical conductive layer are disposed at a same layer, the first metal layer includes gate patterns of the transistors, and the first transparent electrical conductive layer includes low electrode patterns of the photosensors.

In one embodiment of the display panel, the fingerprint recognition layer further includes a substrate layer, the first metal layer and the first transparent electrical conductive layer both are disposed on a surface of the substrate layer, and the light path layer is disposed on another surface of the substrate layer.

In one embodiment of the display panel, the first metal layer includes a first metal film layer and a second metal film layer stacked on the first metal film layer.

In one embodiment of the display panel, the first metal layer further includes a third metal film layer stacked on the second metal film layer, the first metal film layer is made of titanium, the second metal film layer is made of aluminum, and the third metal film layer is made of titanium.

In one embodiment of the display panel, the fingerprint recognition layer further includes a gate insulating layer covering the first metal layer and the first transparent electrical conductive layer and defining a first hole corresponding to each low electrode pattern, and the photosensitive layer patterns are disposed in the first holes.

In one embodiment of the display panel, the gate insulating layer includes a first gate insulating film layer and a second gate insulating film layer, and the first gate insulating film layer and the second gate insulating film layer are made of silicon nitride and silicon oxide respectively.

In one embodiment of the display panel, the active layer patterns are disposed on a surface of the gate insulating layer away from the first metal layer and correspond to the gate patterns, and orthogonal projections of the active layer patterns projected on the substrate layer fall within orthogonal projections of the gate patterns projected on the substrate layer.

In one embodiment of the display panel, the fingerprint recognition layer further includes N+ amorphous silicon layer and a second metal layer, the second metal layer is disposed on a surface of the N+ amorphous silicon layer, the second metal layer included source/drain patterns of the transistors and top electrode patterns of the photosensors, the N+ amorphous silicon layer includes ohmic contact layer patterns disposed between the source/drain patterns and the active layer patterns and ohmic contact layer patterns disposed between the top electrode patterns and the photosensitive layer patterns.

In one embodiment of the display panel, the active layer patterns and the photosensitive layer patterns are both made of amorphous silicon, and the N+ amorphous silicon layer is surfaces of the active layer patterns and the photosensitive layer patterns implanting with high-concentration N-type impurity ions.

In one embodiment of the display panel, sources or drains of the transistors are connected to the low electrode patterns through second holes of the gate insulating layer.

In one embodiment of the display panel, the fingerprint recognition layer further includes second transparent electrical conductive layer disposed on a surface of the second metal layer away from the N+ amorphous silicon layer.

In one embodiment of the display panel, the fingerprint recognition layer further includes bonding terminals, the first metal layer further includes a trace patterns of the bonding terminals, the first transparent electrical conductive layer further includes a transparent electrical conductive patterns of the bonding terminals, the transparent electrical conductive patterns cover the trace patterns, the second metal layer further includes bonding pad patterns of the bonding terminals, the bonding pad patterns are connected to the transparent electrical conductive patterns through third holes of the gate insulating layer, the second transparent electrical conductive layer further includes protective patterns of the bonding terminals, and the protective patterns cover the bonding pad patterns.

Another embodiment of the disclosure further provides a method of manufacturing a display panel, including:

providing a substrate layer;

providing a first metal layer on a first surface of the substrate layer and patterning the first metal layer to form gate patterns;

providing a first transparent electrical conductive layer on the first surface of the substrate layer and patterning the first transparent electrical conductive layer to form low electrode patterns;

providing a gate insulating layer on the first metal layer and the first transparent electrical conductive layer and patterning the gate insulating layer to form first holes corresponding to the low electrode patterns;

providing an amorphous silicon layer on the gate insulating layer;

providing a N+ amorphous silicon layer on the amorphous silicon layer and patterning the N+ amorphous silicon layer and the amorphous silicon layer to form active layer patterns corresponding to the gate patterns, photosensitive layer patterns disposed in the first holes, and ohmic contact layer patterns disposed on the active layer patterns and on the photosensitive layer patterns;

providing a second metal layer on the N+ amorphous silicon layer and patterning the second metal layer to form source/drain patterns corresponding to the active layer patterns and top electrode patterns corresponding to the photosensitive layer patterns;

providing an insulating protective layer on the second metal layer;

inverting the substrate layer and providing a light path layer on a second surface of the substrate layer, wherein the second surface of the substrate layer is away from the amorphous silicon layer; and providing a display panel main body on the light path layer.

In one embodiment of the method of manufacturing the display panel, the step of providing the N+ amorphous silicon layer on the amorphous silicon layer includes: implanting the amorphous silicon layer with high-concentration N-type impurity ions.

In one embodiment of the method of manufacturing the display panel, the first metal layer comprises a first metal film layer and a second metal film layer stacked on the first metal film layer.

In one embodiment of the method of manufacturing the display panel, the first metal layer further comprises a third metal film layer stacked on the second metal film layer, the first metal film layer is made of titanium, the second metal film layer is made of aluminum, and the third metal film layer is made of titanium.

In one embodiment of the method of manufacturing the display panel, the display panel comprises a fingerprint recognition layer, the fingerprint recognition layer comprises a plurality of transistors arranged in an array and a plurality of photosensors electrically connected to the plurality of transistors.

In one embodiment of the method of manufacturing the display panel, the gate insulating layer comprises a first gate insulating film layer and a second gate insulating film layer, and the first gate insulating film layer and the second gate insulating film layer are made of silicon nitride and silicon oxide respectively.

In one embodiment of the method of manufacturing the display panel, the active layer patterns are disposed on a surface of the gate insulating layer away from the first metal layer and correspond to the gate patterns, and orthogonal projections of the active layer patterns projected on the substrate layer fall within orthogonal projections of the gate patterns projected on the substrate layer.

In comparison with prior art, the disclosure provides the display panel and the method of manufacturing the display panel. The photosensor is inverted to let the amorphous silicon layer or the N+ amorphous silicon layer of the transistors and the photosensors formed in the same step to save photomasks and processes. Furthermore, the fingerprint recognition layer is inverted and attached under the light path layer. The gates of the transistors behave as a light shading layer to overcome the issue of integrate optical fingerprint recognition functions inside the LCD screen.

DETAILED DESCRIPTION

The specific structure and functional details disclosed herein are only representative and are used for the purpose of describing exemplary embodiments of the present application. However, this application can be implemented in many alternative forms, and should not be interpreted as being limited only to the embodiments set forth herein.

In the description of this application, it should be understood that the terms "center", "lateral", "upper", "lower", "left", "right", "vertical", "horizontal", "top", the orientation or positional relationship indicated by "bottom", "inner", "outer", etc. is based on the orientation or positional relationship shown in the drawings, and is only for the convenience of describing the application and simplifying the description, and does not indicate or imply the pointed device or the element must have a specific orientation, be constructed and operated in a specific orientation, and therefore cannot be understood as a limitation of the present application. In addition, the terms "first" and "second" are only used for descriptive purposes and cannot be understood as indicating or implying relative importance or implicitly indicating the number of indicated technical features. Therefore, the features defined with "first" and "second" may explicitly or implicitly include one or more of these features. In the description of this application, unless otherwise specified, "plurality" means two or more. In addition, the term "including" and any variations thereof is intended to cover non-exclusive inclusion.

In the description of this application, it should be noted that the terms "installation" and "connection" should be understood in a broad sense unless otherwise clearly specified and limited. For example, it can be a support connection or a detachable connection. Connected or integrally connected; it can be a mechanical connection or an electrical connection; it can be directly connected or indirectly connected through an intermediate medium, and it can be the internal communication between two components. For those of ordinary skill in the art, the specific meanings of the above-mentioned terms in this application can be understood under specific circumstances.

The terminology used here is only for describing specific embodiments and is not intended to limit the exemplary embodiments. Unless the context clearly dictates otherwise, the singular forms "a" and "one" used herein are also intended to include the plural. It should also be understood that the terms "including" and/or "comprising" used herein specify the existence of the stated features, integers, steps, operations, units and/or components, and do not exclude the existence or addition of one or more other features, integers, steps, operations, units, components, and/or combinations thereof.

The application will be further described below in conjunction with the drawings and embodiments.

In the figures, units with similar structures are indicated by the same reference numerals.

Figure 9:
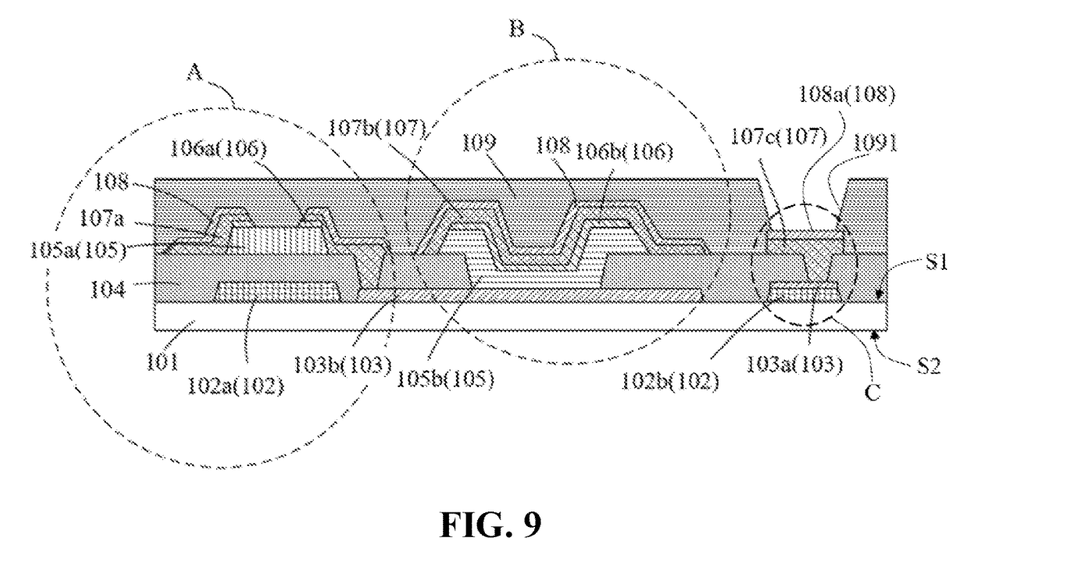
FIG. 9 is a ninth schematic view of a process of manufacturing a display panel of the present disclosure.
Figure 10:
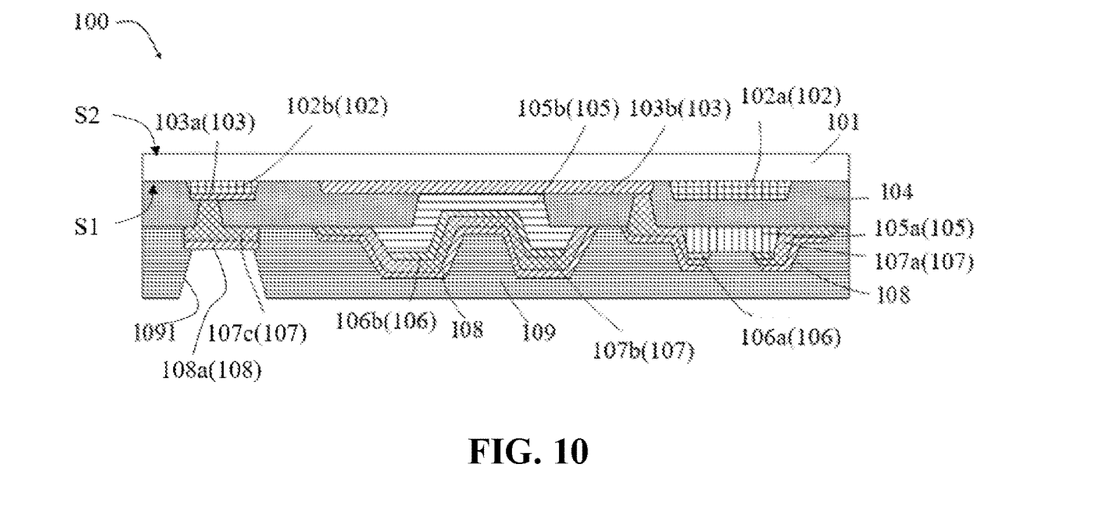
FIG. 10 is a tenth schematic view of a process of manufacturing a display panel of the present disclosure.
Figure 11:
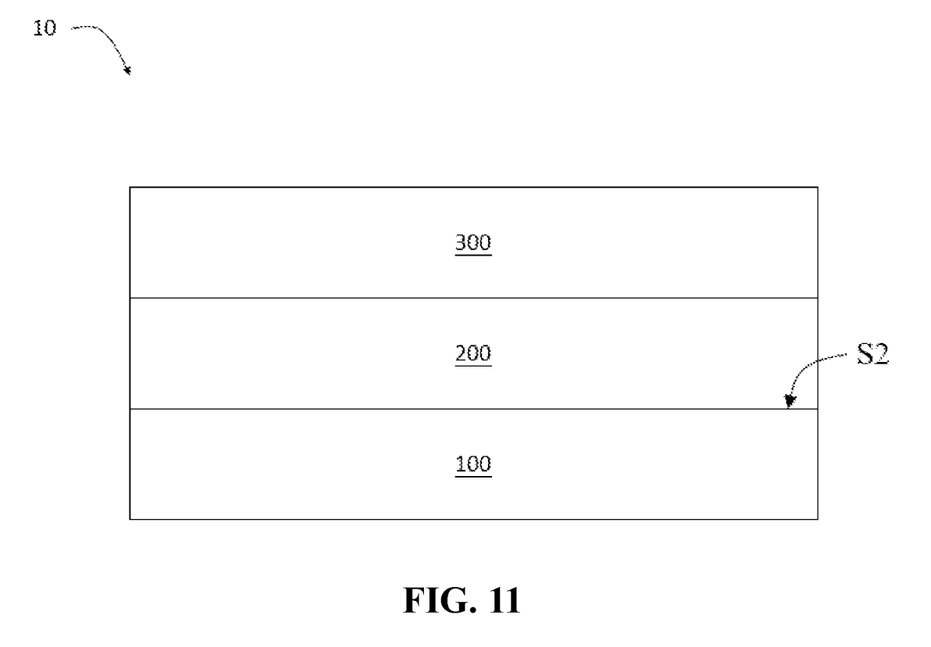
FIG. 11 is a schematic view of a structure of a display panel of the present disclosure.

Referring to FIGS. 9-11, one embodiment of the disclosure provides a display panel 10, including:
  a fingerprint recognition layer 100; a light path layer 200 disposed on the fingerprint recognition layer; and a display panel main body 300 disposed on the light path layer 200, wherein the fingerprint recognition layer 100 includes a plurality of transistors A (FIG. 9 only shows one transistor as a representative) arranged in an array and a plurality of photosensors B (FIG. 9 only shows one photosensor as a representative) electrically connected to the plurality of transistors A; and active layer patterns 105a of the transistors A and photosensitive layer patterns 105b of the photosensors B are disposed at a same layer.

In detail, the active layer patterns 105a of the transistors A and the photosensitive layer patterns 105b of the photosensors B are made of amorphous silicon. In detail, the fingerprint recognition layer 100 further includes amorphous silicon layer 105. The amorphous silicon layer 105 includes the active layer patterns 105a of the transistors A and the photosensitive layer patterns 105b of the photosensors B.

In detail, the display panel 10 includes the fingerprint recognition layer 100, the light path layer 200, and the display panel main body 300. The display panel 10 can be a device with touch and display functions, such as a mobile phone, a tablet computer, a touch screen, a smart wearable device, and so on. The fingerprint recognition layer 100 includes an optical fingerprint recognition component. The display panel main body 300 can be a display panel such as an organic light emitting diode display panel, a liquid crystal display panel, etc. the disclosure doesn't limit these.

In detail, the fingerprint recognition layer 100 of the display panel 10 includes the substrate layer 101, a first metal layer 102, a first transparent electrical conductive layer 103, a gate insulating layer 104, the amorphous silicon layer 105, a N+ amorphous silicon layer 106, a second metal layer 107, a second transparent electrical conductive layer 108, and a insulating protective layer 109.

In one embodiment, a fingerprint recognition circuit of the fingerprint recognition layer 100 includes the transistors A and the photosensors B including PIN type sensors.

In one embodiment, the substrate layer 101 is made of a transparent material, such as glass. In other embodiment, the substrate layer 101 is made of a flexible transparent material such as polyimide if the fingerprint recognition layer 100 is applying on a flexible display panel 10.

The first metal layer 102 is disposed on a first surface S1 of the substrate layer 101 and token as a gate 102a of the transistors A.

In one embodiment of the display panel, the fingerprint recognition layer 100 further includes a first metal layer 102 and a first transparent electrical conductive layer 103. The first metal layer 102 and the first transparent electrical conductive layer 103 are disposed at a same layer. The first metal layer 102 includes gate patterns 102a of the transistors A. The first transparent electrical conductive layer 103 includes low electrode patterns 103b of the photosensors B.

Figure 2:
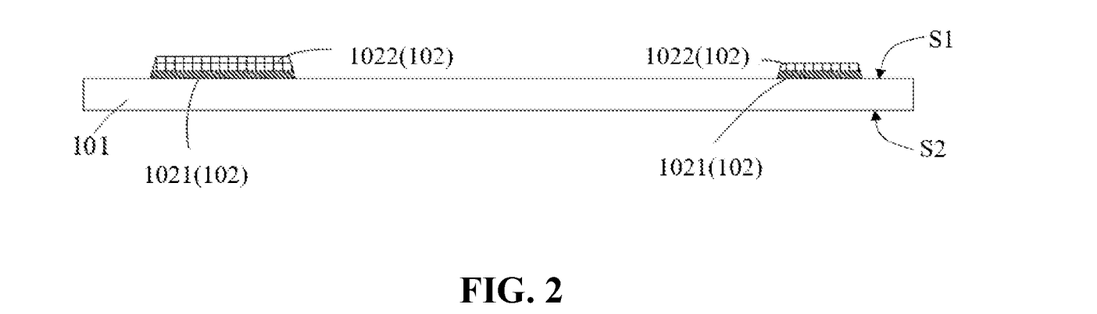
FIG. 2 is a second schematic view of a process of manufacturing a display panel of the present disclosure.
Figure 3:
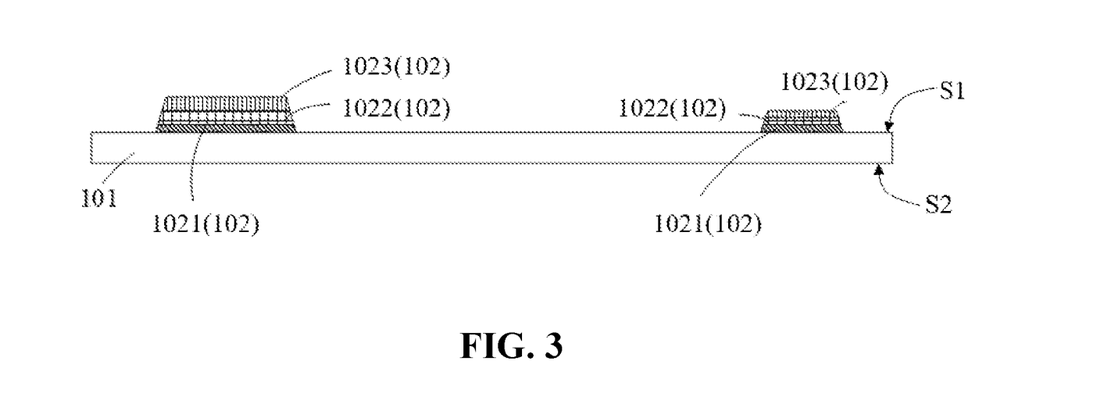
FIG. 3 is a third schematic view of a process of manufacturing a display panel of the present disclosure.

In detail, the first metal layer 102 can be a single-layer film made of an opaque metal with good conductivity such as molybdenum, tungsten, copper, titanium, and aluminum. In another embodiment, as shown in FIG. 2, the first metal layer 102 can also be a laminated first metal film layer 1021 and second metal film layer 1022 formed of a metal with good conductivity such as molybdenum, tungsten, copper, titanium, and aluminum. For example, the first metal film layer 1021 and the second metal film layer 1022 may be a stacked structure formed by molybdenum and tungsten or molybdenum and copper. For example, the first metal film layer 1021 is made of molybdenum, and the second metal film layer 1022 is made of tungsten. In other embodiments, as shown in FIG. 3, the first metal film layer 1021, the second metal film layer 1022, and the third metal film layer 1023 can be a laminated structure formed by titanium and aluminum, such as the first metal film layer 1021 is made of titanium, the second metal film layer 1022 is made of aluminum, and the third metal film layer 1023 is made of titanium.

Figure 4:
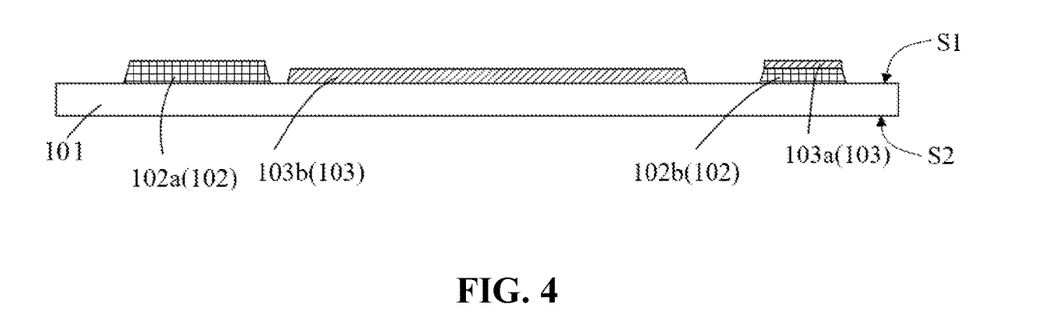
FIG. 4 is a fourth schematic view of a process of manufacturing a display panel of the present disclosure.

In detail, as shown in FIG. 4, the first transparent electrical conductive layer 103 is disposed on the first surface S1 of the substrate layer 101, and a part of the first transparent electrical conductive layer 103 (103a) covers a part of the first metal layer 102 (102b). In one embodiment, the first transparent electrical conductive layer 103 is made of indium tin oxide, and may be used as the low electrode of the photosensor, but it is not limited to this. The first transparent electrical conductive layer 103 can be made of other materials, such as tin oxide (SnO2), zinc oxide (ZnO), etc. It is not limited to this. In addition, there is a gap between an orthogonal projection of the low electrode patterns 103b and the gate patterns 102a on the substrate layer. In detail, as shown in FIGS. 10 and 11, the low electrode patterns 103b are disposed between the photosensitive layer patterns 105 b and the light path layer 200. The gate patterns 102a are disposed between the active layer patterns 105a and the light path layer 200.

Figure 6:
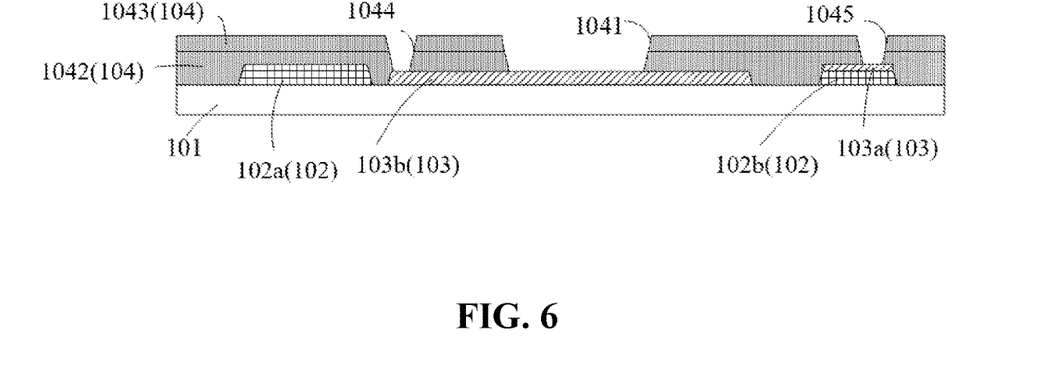
FIG. 6 is a sixth schematic view of a process of manufacturing a display panel of the present disclosure.
Figure 7:
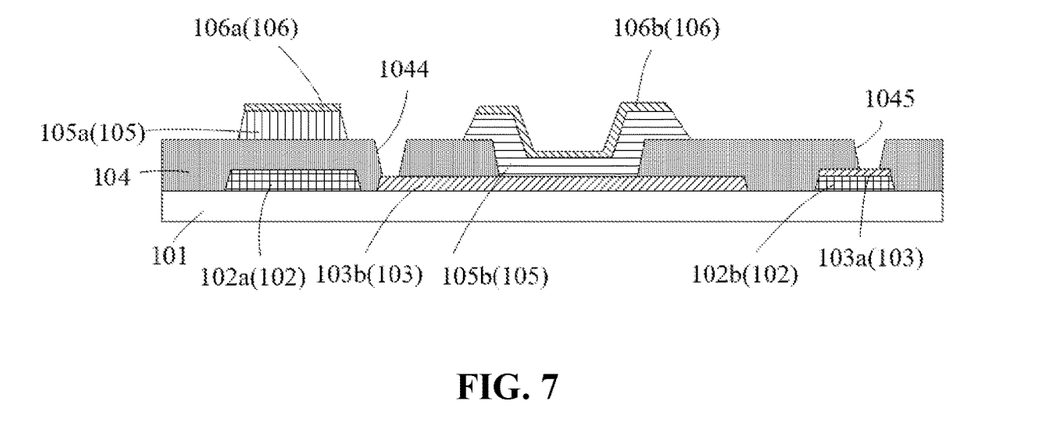
FIG. 7 is a seventh schematic view of a process of manufacturing a display panel of the present disclosure.

In the embodiment of the present disclosure, the fingerprint recognition layer 100 further includes a gate insulating layer 104 covering surfaces of the first metal layer 102 and the first transparent electrical conductive layer 103. Referring to FIG. 6 and FIG. 7, the gate insulating layer 104 is provided with a first hole 1041 and a second hole 1044 corresponding to each of the low electrode patterns 103b. The photosensitive layer patterns 105b are disposed in the first hole 1041. In detail, the gate insulating layer 104 further defines third holes 1045 corresponding to the first transparent electrical conductive layer 103 (103a).

In detail, as shown in FIG. 6, the gate insulating layer 104 is disposed on the first metal layer 102 and the first transparent electrical conductive layer 103. The first holes 1041, the second holes 1044, and the third holes 1045 are defined on the gate insulating layer 104. In an embodiment, the gate insulating layer 104 includes one or more of silicon nitride (SiNx), silicon oxide (SiOx), and silicon oxynitride (SiNxOy). The gate insulating layer 104 includes at least one film layer. In detail, the gate insulating layer 104 is a single-layer film including only the first gate insulating film layer 1042, or is a double-layer film including the first gate insulating film layer 1042 and the second gate insulating film layer 1043. The first gate insulating film layer 1042 and the second gate insulating film layer 1043 are made of silicon nitride and silicon oxide respectively and formed a laminated structure.

As shown in FIG. 9, in one embodiment of the present application, the fingerprint recognition layer 100 further includes an N+ amorphous silicon layer 106 and a second metal layer 107. The second metal layer 107 is disposed on a surface of the N+ amorphous silicon layer 106. The second metal layer 107 includes the source/drain patterns 107a of the transistors A and the top electrode patterns 107b of the photosensors B. The N+ amorphous silicon layer 106 includes ohmic contact layer patterns 106a disposed between the source/drain pattern 107a and the active layer patterns 105a and ohmic contact layer patterns 106b disposed between the top electrode patterns 107b and the photosensitive layer patterns 105b.

In detail, as shown in FIG. 9, in an embodiment of the present disclosure, the source/drain patterns 107a include sources and drains of the transistors A. An ohmic contact layer patterns 106a is disposed between the source and the active layer pattern 105a. Another ohmic contact layer pattern 106a is also disposed between the drain and the active layer pattern 105a. These two ohmic contact layer patterns 106a are not connected. In detail, as shown in FIG. 9, a layer of the ohmic contact layer pattern 106b may be provided between the top electrode patterns 107b and the photosensitive layer patterns 105b.

Figure 8:
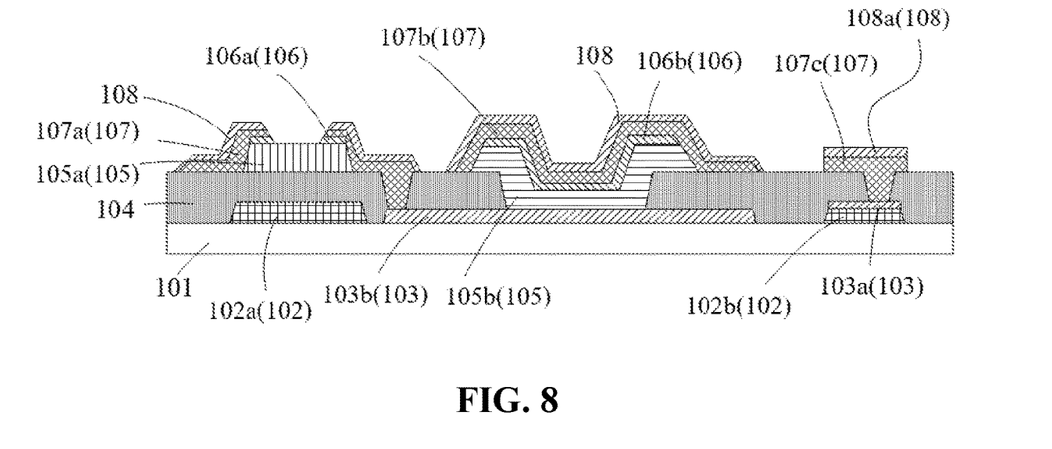
FIG. 8 is a eighth schematic view of a process of manufacturing a display panel of the present disclosure.

In detail, as shown in FIGS. 6, 8 and 9, in an embodiment of the present disclosure, the source or drain of the transistor A is connected to the low electrode pattern 103b through the second hole 1044 in the gate insulating layer 104.

In detail, as shown in FIGS. 6, 7, 8 and 9, the amorphous silicon layer 105 is disposed on the gate insulating layer 104. The N+ amorphous silicon layer 106 is disposed on the amorphous silicon layer 105. In detail, a part of the amorphous silicon layer 105 is disposed in the first hole 1041 to serve as the photosensitive layer pattern 105b of the photosensor B. Another part of the amorphous silicon layer 105 is disposed on the gate insulating layer 104 and corresponding to the gate pattern 102a to serve as the active layer pattern 105a of the transistor A. Part of the N+ amorphous silicon layer 106 is disposed on the photosensitive layer pattern 105b to serve as an ohmic contact layer pattern 106b between the top electrode pattern 107b and the photosensitive layer pattern 105b. Another part of the N+ amorphous silicon layer 106 is disposed on the active layer pattern 105a to serve as the ohmic contact layer pattern 106a between the source/drain pattern 107a and the active layer pattern 105a. The N+ amorphous silicon layer 106 is used as an ohmic contact layer between the semiconductor layer and the metal layer in this embodiment to reduce the impedance between the semiconductor layer and the metal layer.

In addition, in one embodiment, the active layer pattern 105a is disposed on a surface of the gate insulating layer 104 away from the first metal layer 102 and corresponds to the gate pattern 102a, wherein an orthogonal projection of the active layer pattern 105a on the substrate layer 101 falls within an orthogonal projection of the gate pattern 102a on the substrate layer 101. Therefore, the gate pattern 102a can also function as a light block to avoid the threshold voltage of the active layer pattern 105a from affected by ambient light.

In detail, as shown in FIGS. 8 and 9, the second metal layer 107 is disposed on the N+ amorphous silicon layer 106. After the second metal layer 107 is formed, the source/drain pattern 107a of the transistor A is formed by a patterning process. The second metal layer 107 in the photosensor B is used as the top electrode pattern 107b of the photosensor.

In addition, as shown in FIG. 8, in one embodiment, the fingerprint recognition layer 100 further includes a second transparent electrical conductive layer 108 disposed on a surface of the second metal layer 107 away from the N+ amorphous silicon layer 106.

In detail, the second transparent electrical conductive layer 108 is disposed on the second metal layer 107 to avoid oxidation of the second metal layer 107 to prevent from binding defect with other devices. The second transparent electrical conductive layer 108 can also be used as an in-circuit wiring of the fingerprint recognition layer 100. In an embodiment, the second transparent electrical conductive layer 108 can be used as the top electrode of the photosensor instead of the second metal layer 107 as the top electrode of the photosensor.

As shown in FIG. 9, the insulating protective layer 109 is disposed on the second metal layer 107. The insulating protective layer 109 is provided with a fourth hole 1091. In an embodiment, an integrated circuit, such as a control chip, a driver chip, etc., may be bonded to the binding terminal C of the fingerprint recognition layer 100 through the fourth hole 1091.

As shown in FIG. 9, FIG. 10 and FIG. 11, the light path layer 200 is disposed on a second surface S2 of the substrate layer 101. The first surface S1 and the second surface S2 are different surfaces. In detail, as shown in FIG. 10, the fingerprint recognition layer 100 as shown in FIG. 9 is turned over. Then, the light path layer 200 is disposed on the second surface S2 of the substrate layer 101. In other words, the light path layer 200 and the film layer on the substrate layer 101 are arranged opposite to each other. In detail, the light path layer 200 can guide the reflected light of the fingerprint to the fingerprint recognition layer 100. The light path layer 200 includes a light guide structure or an aperture array structure. In addition, the light path layer 200 sets according to the sensing light source of the fingerprint recognition layer 100. For example, the sensing light source of the fingerprint recognition layer 100 is arranged on a side of the light path layer 200 or at the bottom of the fingerprint recognition layer 100. The photosensor of the fingerprint recognition layer 100 also needs to be provided with a light-shielding structure according to actual needs to avoid mis-operation.

As shown in FIG. 11, the display panel main body 300 is disposed on the light path layer 200 for display. In addition, the display panel main body 300 includes, for example, a display substrate layer, a cathode layer, an anode layer, a display function film layer, and the like. The film layers included in the display panel main body 300 are set according to the type of the display panel main body 300, which is not shown in FIG. 11.

In the present disclosure, compared with prior art, because the photosensor is inverted, the amorphous silicon (a-Si) film layer or the N+ amorphous silicon (N+a-Si) film layer of the transistor and the photosensor can be provided in the same process, thus saving the photomask and manufacturing process. In addition, the fingerprint recognition layer 100 of the present disclosure is flipped and attached under the light path layer, so the gate of the transistor can also serve as a light shielding layer, which overcomes the problem of integrating the optical fingerprint recognition function inside the above-mentioned liquid crystal screen.

As shown in FIG. 7 and FIG. 9, in one embodiment of the disclosure, the fingerprint recognition layer 100 further includes bonding terminals C. The first metal layer 102 further includes a trace patterns 102b of the bonding terminals C. The first transparent electrical conductive layer 103 further includes a transparent electrical conductive patterns 103a of the bonding terminals C. The transparent electrical conductive patterns 103a cover the trace patterns 102b. The second metal layer 107 further includes bonding pad patterns 107c of the bonding terminals C. The bonding pad patterns 107c are connected to the transparent electrical conductive patterns 103a through third holes 1045 of the gate insulating layer 104. The second transparent electrical conductive layer 108 further includes protective patterns 108a of the bonding terminals C. The protective patterns 108a cover the bonding pad patterns 107c.

Figure 12:
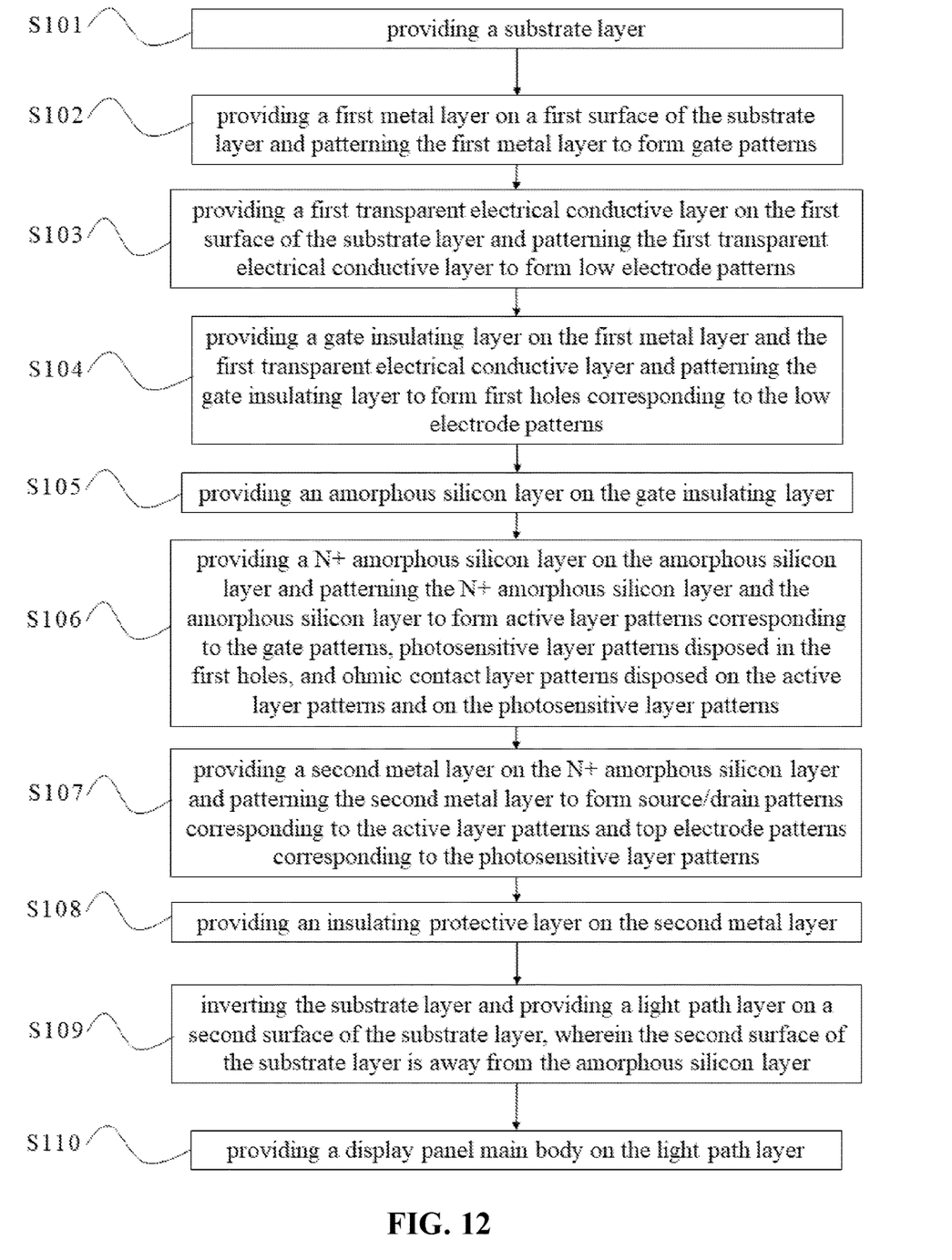
FIG. 12 is a schematic flowchart of a method of manufacturing a display panel of the present disclosure.

As shown in FIG. 12, another embodiment of the disclosure further provides a method of manufacturing a display panel, including:

Step S101: providing a substrate layer 101;

Step S102: providing a first metal layer 102 on a first surface S1 of the substrate layer 101 and patterning the first metal layer 102 to form gate patterns 102a;

Step S103: providing a first transparent electrical conductive layer 103 on the first surface S1 of the substrate layer 101 and patterning the first transparent electrical conductive layer 103 to form low electrode patterns 103b;

Step S104: providing a gate insulating layer 104 on the first metal layer 102 and the first transparent electrical conductive layer 103 and patterning the gate insulating layer 104 to form first holes 1041 corresponding to the low electrode patterns 103b;

Step S105: providing an amorphous silicon layer 105 on the gate insulating layer 104;

Step S106: providing a N+ amorphous silicon layer 106 on the amorphous silicon layer 105 and patterning the N+ amorphous silicon layer 106 and the amorphous silicon layer 105 to form active layer patterns 105a corresponding to the gate patterns 102a, photosensitive layer patterns 105b disposed in the first holes 1041, and ohmic contact layer patterns 106b disposed on the active layer patterns 105a and on the photosensitive layer patterns 105b;

Step S107: providing a second metal layer 107 on the N+ amorphous silicon layer 106 and patterning the second metal layer 107 to form source/drain patterns 107a corresponding to the active layer patterns 105a and top electrode patterns 107b corresponding to the photosensitive layer patterns 105b;

Step S108: providing an insulating protective layer 109 on the second metal layer 107;

Step S109: inverting the substrate layer 101 and providing a light path layer 200 on a second surface S2 of the substrate layer 101, wherein the second surface S2 of the substrate layer 101 is away from the amorphous silicon layer 105; and Step S110: providing a display panel main body 300 on the light path layer 200.

The method of manufacturing the display panel 10 in the present disclosure will be described in detail below. The method of manufacturing the display panel 10 includes the following steps.

Figure 1:
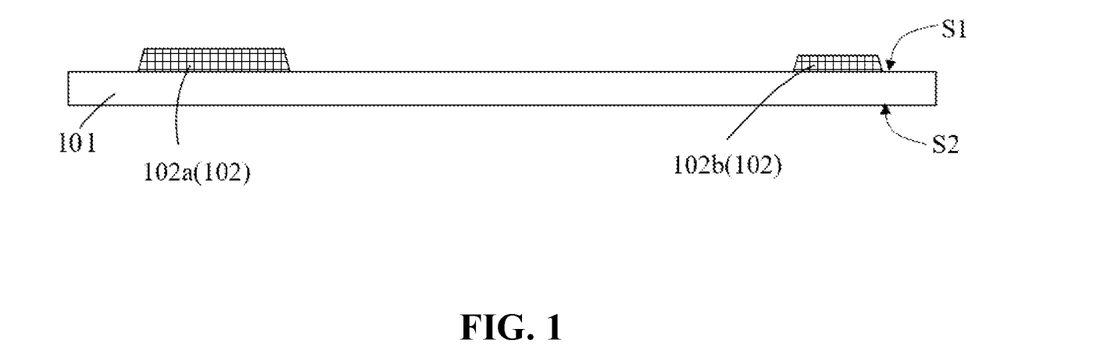
FIG. 1 is a first schematic view of a process of manufacturing a display panel of the present disclosure.

As shown in FIG. 1, in step S101: a substrate layer 101 is provided. The substrate layer 101 is made of a transparent material, such as glass. In other embodiments, if the fingerprint recognition layer 100 is applied to a flexible display panel 10, the substrate layer 101 can be made of a flexible transparent material, such as polyimide.

As shown in FIG. 1, in step S102: the first metal layer 102 is disposed on the first surface S1 of the substrate layer 101. The metal film layer can be formed on the first surface S1 of the substrate layer 101 by processes such as deposition, exposure, and etching. Whether to form multiple layers can be adjusted according to actual requirements.

As shown in FIGS. 2 and 3, it is further illustrated that the first metal layer 102 may be a single-layer film formed of molybdenum, tungsten, copper, titanium, aluminum and other opaque and conductive metals. In another embodiment, as shown in FIG. 2, the first metal layer 102 may also be laminated first metal film layer 1021 and second metal film layer 1022 formed of a metal with good conductivity such as molybdenum, tungsten, copper, titanium, and aluminum. For example, the first metal film layer 1021 and the second metal film layer 1022 may be a stacked structure formed by molybdenum and tungsten or a stacked structure formed by molybdenum and copper. For example, the first metal film layer 1021 is made of molybdenum, and the second metal film layer 1022 is made of tungsten. In other embodiments, as shown in FIG. 3, the first metal film layer 1021, the second metal film layer 1022, and the third metal film layer 1023 may be a laminated structure formed by titanium and aluminum, such as the first metal film layer 1021 is made of titanium, the second metal film layer 1022 is made of aluminum, and the third metal film layer 1023 is made of titanium.

As shown in FIG. 4, in step S103: the first transparent electrical conductive layer 103 is disposed on the first surface S1 of the substrate layer 101 and on a part of the first metal layer 102 (102b). In an embodiment, the first transparent electrical conductive layer 103 may be coated on the first surface S1 of the substrate layer 101 and on a part of the first metal layer 102 (102b).

In one embodiment, the first transparent electrical conductive layer 103 may be made of indium tin oxide, and may be used as the low electrode of the photosensor, but it is not limited to this. The first transparent electrical conductive layer 103 can also be made of other materials, such as tin oxide (SnO2), zinc oxide (ZnO), etc. It is not limited to this.

Figure 5:
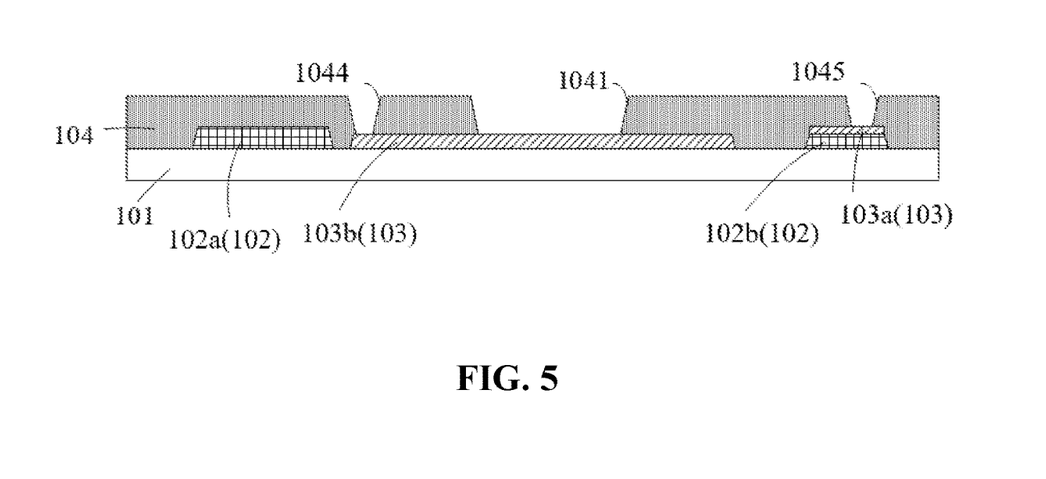
FIG. 5 is a fifth schematic view of a process of manufacturing a display panel of the present disclosure.

As shown in FIGS. 5 and 6, in step S104: a gate insulating layer 104 is disposed on the first metal layer 102 and the first transparent electrical conductive layer 103. The gate insulating layer 104 formed of a single material or the gate insulating layer 104 having a stacked structure by deposition method according to actual needs.

In an embodiment, the gate insulating layer 104 includes one or more of silicon nitride (SiNx), silicon oxide (SiOx), and silicon oxynitride (SiNxOy). The gate insulating layer 104 includes at least one film layer. In detail, the gate insulating layer 104 is a single-layer film including only the first gate insulating film layer 1042 or a double-layer film including the first gate insulating film layer 1042 and the second gate insulating film layer 1043. The first gate insulating film layer 1042 and the second gate insulating film layer 1043 are made of silicon nitride and silicon oxide, respectively and formed a laminated structure.

As shown in FIGS. 5 and 6, in step S104: the gate insulating layer 104 is patterned to form a first hole 1041 corresponding to the low electrode pattern 103b. The first hole 1041 is defined on the gate insulating layer 104 by etching.

As shown in FIG. 7, in step S105: an amorphous silicon layer 105 is disposed on the gate insulating layer 104. In detail, the amorphous silicon layer 105 can be formed by vapor deposition of an amorphous silicon film, including methods such as vacuum evaporation, glow discharge, sputtering, and chemical vapor deposition.

As shown in FIG. 7, in step S106: an N+ amorphous silicon layer 106 is disposed on the amorphous silicon layer 105. In detail, after the deposition of the amorphous silicon layer 105 is completed in step S105, high-concentration ion implantation is performed on the amorphous silicon layer 105 to form the N+ amorphous silicon layer 106. In detail, N-type impurities such as phosphorus is provided.

Next, patterning the N+ amorphous silicon layer 106 and the amorphous silicon layer 105 to form an active layer pattern 105a corresponding to the gate pattern 102a and a photosensitive layer pattern 105b located in the first through hole 1041, an ohmic contact layer pattern 106a on the active layer pattern 105a, and an ohmic contact layer pattern 106b on the photosensitive layer pattern 105b.

In other words, the amorphous silicon layer 105 and the N+ amorphous silicon layer 106 form the active layer pattern 105a, the photosensitive layer pattern 105b, and the ohmic contact layer patterns 106a and 106b in a single process, thereby reducing the photomask and manufacturing process.

As shown in FIG. 8, in step S107: the second metal layer 107 is disposed on the N+ amorphous silicon layer 106 by vapor deposition or the like. After the second metal layer 107 is formed, the second metal layer 107 is patterned by exposure, development and etching to form a source/drain pattern 107a corresponding to the active layer pattern 105a and a top electrode pattern 107b corresponding to the photosensitive layer pattern 105b.

As shown in FIG. 8, after step S107, the method may further include a step of: disposing a second transparent electrical conductive layer 108 on the second metal layer 107. In an embodiment, the second transparent electrical conductive layer 108 may also be omitted to save the manufacturing process. For the details of the second transparent electrical conductive layer 108, please refer to the foregoing description, which will not be repeated here. As shown in FIG. 9, in step S108: an insulating protection layer 109 is disposed on the second metal layer 107 or on the second transparent electrical conductive layer 108.

As shown in FIG. 9, a fourth hole 1091 can be opened on the insulating protection layer 109 by etching or the like for the bonding of integrated circuits.

As shown in FIG. 10, in step S109: the substrate layer 101 is inverted.

As shown in FIG. 11, the light path layer 200 is disposed on the second surface S2 of the substrate layer 101. In addition, the first surface S1 and the second surface S2 of the substrate layer 101 are different surfaces. In detail, the second surface S2 is the surface of the substrate layer 101 away from the amorphous silicon layer 105. In other words, the light path layer 200 and other film layers disposed on the substrate layer 101 are disposed oppositely, but it is not limited to this, and can be configured according to actual needs.

As shown in FIG. 11, in step S110: the display panel main body 300 is disposed on the light path layer 200. After step S110, a bonding process, a testing process, etc. may also be included.

In comparison with prior art, the disclosure provides the display panel 10 and the method of manufacturing the display panel. The photosensor is inverted to let the amorphous silicon layer or the N+ amorphous silicon layer of the transistors and the photosensors formed in the same step to save photomasks and processes. Furthermore, the fingerprint recognition layer 100 is inverted and attached under the light path layer 200. The gates of the transistors behave as a light shading layer to overcome the issue of integrate optical fingerprint recognition functions inside the LCD screen.

The present disclosure of the display panel and the method of manufacturing the display panel have been described by the above embodiments, but the embodiments are merely examples for implementing the present disclosure. It must be noted that the embodiments do not limit the scope of the invention. In contrast, modifications and equivalent arrangements are intended to be included within the scope of the invention.

What is claimed is:

1. A display panel, comprising:
   a fingerprint recognition layer;
   a light path layer disposed on the fingerprint recognition layer; and
   a display panel main body disposed on the light path layer, wherein
   the fingerprint recognition layer comprises a plurality of transistors arranged in an array and a plurality of photosensors electrically connected to the plurality of transistors; and
   active layer patterns of the transistors and photosensitive layer patterns of the photosensors are disposed at a same layer;
   wherein the fingerprint recognition layer further comprises a first metal layer and a first transparent electrical conductive layer, the first metal layer and the first transparent electrical conductive layer are disposed at a same layer, the first metal layer comprises gate patterns of the transistors, and the first transparent electrical conductive layer comprises low electrode patterns of the photosensors.

2. The display panel according to claim 1, wherein the fingerprint recognition layer further comprises a substrate layer, the first metal layer and the first transparent electrical conductive layer both are disposed on a surface of the substrate layer, and the light path layer is disposed on another surface of the substrate layer.

3. The display panel according to claim 2, wherein the first metal layer comprises a first metal film layer and a second metal film layer stacked on the first metal film layer.

4. The display panel according to claim 3, wherein the first metal layer further comprises a third metal film layer stacked on the second metal film layer, the first metal film layer is made of titanium, the second metal film layer is made of aluminum, and the third metal film layer is made of titanium.

5. The display panel according to claim 2, wherein the fingerprint recognition layer further comprises a gate insulating layer covering the first metal layer and the first transparent electrical conductive layer and defining a first hole corresponding to each low electrode pattern, and the photosensitive layer patterns are disposed in the first holes.

6. The display panel according to claim 5, wherein the gate insulating layer comprises a first gate insulating film layer and a second gate insulating film layer, and the first gate insulating film layer and the second gate insulating film layer are made of silicon nitride and silicon oxide respectively.

7. The display panel according to claim 5, wherein the active layer patterns are disposed on a surface of the gate insulating layer away from the first metal layer and correspond to the gate patterns, and orthogonal projections of the active layer patterns projected on the substrate layer fall within orthogonal projections of the gate patterns projected on the substrate layer.

8. The display panel according to claim 5, wherein the fingerprint recognition layer further comprises N+ amorphous silicon layer and a second metal layer, the second metal layer is disposed on a surface of the N+ amorphous silicon layer, the second metal layer comprises source/drain patterns of the transistors and top electrode patterns of the photosensors, the N+ amorphous silicon layer comprises ohmic contact layer patterns disposed between the source/drain patterns and the active layer patterns and ohmic contact layer patterns disposed between the top electrode patterns and the photosensitive layer patterns.

9. The display panel according to claim 8, wherein the active layer patterns and the photosensitive layer patterns are both made of amorphous silicon, and the N+ amorphous silicon layer is surfaces of the active layer patterns and the photosensitive layer patterns implanting with high-concentration N-type impurity ions.

10. The display panel according to claim 8, wherein sources or drains of the transistors are connected to the low electrode patterns through second holes of the gate insulating layer.

11. The display panel according to claim 8, wherein the fingerprint recognition layer further comprises a second transparent electrical conductive layer disposed on a surface of the second metal layer away from the N+ amorphous silicon layer.

12. The display panel according to claim 11, wherein the fingerprint recognition layer further comprises bonding terminals, the first metal layer further comprises trace patterns of the bonding terminals, the first transparent electrical conductive layer further comprises transparent electrical conductive patterns of the bonding terminals, the transparent electrical conductive patterns cover the trace patterns, the second metal layer further comprises bonding pad patterns of the bonding terminals, the bonding pad patterns are connected to the transparent electrical conductive patterns through third holes of the gate insulating layer, the second transparent electrical conductive layer further comprises protective patterns of the bonding terminals, and the protective patterns cover the bonding pad patterns.

13. A method of manufacturing a display panel, comprising:
providing a substrate layer;
providing a first metal layer on a first surface of the substrate layer and patterning the first metal layer to form gate patterns;
providing a first transparent electrical conductive layer on the first surface of the substrate layer and patterning the first transparent electrical conductive layer to form low electrode patterns;
providing a gate insulating layer on the first metal layer and the first transparent electrical conductive layer and patterning the gate insulating layer to form first holes corresponding to the low electrode patterns;
providing an amorphous silicon layer on the gate insulating layer;
providing a N+ amorphous silicon layer on the amorphous silicon layer and patterning the N+ amorphous silicon layer and the amorphous silicon layer to form active layer patterns corresponding to the gate patterns, photosensitive layer patterns disposed in the first holes, and ohmic contact layer patterns disposed on the active layer patterns and on the photosensitive layer patterns;
providing a second metal layer on the N+ amorphous silicon layer and patterning the second metal layer to form source/drain patterns corresponding to the active layer patterns and top electrode patterns corresponding to the photosensitive layer patterns;
providing an insulating protective layer on the second metal layer;
inverting the substrate layer and providing a light path layer on a second surface of the substrate layer, wherein the second surface of the substrate layer is away from the amorphous silicon layer; and
providing a display panel main body on the light path layer.

14. The method of manufacturing the display panel according to claim 13, wherein the step of providing the N+amorphous silicon layer on the amorphous silicon layer comprises: implanting the amorphous silicon layer with high-concentration N-type impurity ions.

15. The method of manufacturing the display panel according to claim 13, wherein the first metal layer comprises a first metal film layer and a second metal film layer stacked on the first metal film layer.

16. The method of manufacturing the display panel according to claim 13, wherein the first metal layer further comprises a third metal film layer stacked on the second metal film layer, the first metal film layer is made of titanium, the second metal film layer is made of aluminum, and the third metal film layer is made of titanium.

17. The method of manufacturing the display panel according to claim 13, wherein the display panel comprises a fingerprint recognition layer, the fingerprint recognition layer comprises a plurality of transistors arranged in an array and a plurality of photosensors electrically connected to the plurality of transistors.

18. The method of manufacturing the display panel according to claim 13, wherein the gate insulating layer comprises a first gate insulating film layer and a second gate insulating film layer, and the first gate insulating film layer and the second gate insulating film layer are made of silicon nitride and silicon oxide respectively.

19. The method of manufacturing the display panel according to claim 13, wherein the active layer patterns are disposed on a surface of the gate insulating layer away from the first metal layer and correspond to the gate patterns, and orthogonal projections of the active layer patterns projected on the substrate layer fall within orthogonal projections of the gate patterns projected on the substrate layer.

\* \* \* \* \*